United States Patent
Litman et al.

(10) Patent No.: US 10,903,044 B1
(45) Date of Patent: Jan. 26, 2021

(54) FILLING EMPTY STRUCTURES WITH DEPOSITION UNDER HIGH-ENERGY SEM FOR UNIFORM DE LAYERING

(71) Applicant: APPLIED MATERIALS ISRAEL LTD., Rehovot (IL)

(72) Inventors: Alon Litman, Nes-Ziona (IL); Konstantin Chirko, Rehovot (IL); Yehuda Zur, Tel-Aviv (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 16/789,348

(22) Filed: Feb. 12, 2020

(51) Int. Cl.
  *H01J 37/28* (2006.01)
  *H01L 27/108* (2006.01)
  *H01L 27/11556* (2017.01)
  *H01L 27/11582* (2017.01)

(52) U.S. Cl.
  CPC .......... *H01J 37/28* (2013.01); *H01L 27/1085* (2013.01); *H01L 27/11556* (2013.01); *H01L 27/11582* (2013.01); *H01J 2237/2817* (2013.01)

(58) Field of Classification Search
  CPC .............. H01J 37/28; H01J 2237/2817; H01L 27/11582; H01L 27/1085; H01L 27/11556
  USPC ........... 250/306, 307, 310, 311, 492.1–492.3
  See application file for complete search history.

(56) References Cited

U.S. PATENT DOCUMENTS

| 8,709,269 B2 | 4/2014 | Shemesh | |
|---|---|---|---|
| 2009/0114818 A1* | 5/2009 | Casares | H01J 37/3177 250/307 |

OTHER PUBLICATIONS

Ke, et al., "TEM Sample Preparation by FIB for Carbon Nanotube Interconnects", Ultramicroscopy, vol. 109, No. 11, Jun. 11, 2009, pp. 1353-1359.
Park, et al., "Use of Permanent Marker to Deposit a Protection Layer Against FIB Damage in TEM Specimen Preparation", Journal of Microscopy, vol. 255, Issue 3, Received Mar. 2, 2014; accepted May 26, 2014, pp. 180-187.

* cited by examiner

*Primary Examiner* — Michael Maskell
(74) *Attorney, Agent, or Firm* — Kilpatrick Townsend & Stockton LLP

(57) ABSTRACT

A method of evaluating a region of a sample that includes an array of holes separated by solid portions. The method includes positioning the sample within in a vacuum chamber of an evaluation tool that includes a scanning electron microscope (SEM) column and a focused ion beam (FIB); injecting a deposition gas onto the sample; scanning, with a first charged particle beam, a portion of the sample that includes a plurality of holes in the array of holes to locally deposit material within the plurality of holes in the scanned portion from the deposition gas; and milling, with the FIB column, the portion of the sample that includes the plurality of holes in which the material was locally deposited.

20 Claims, 8 Drawing Sheets

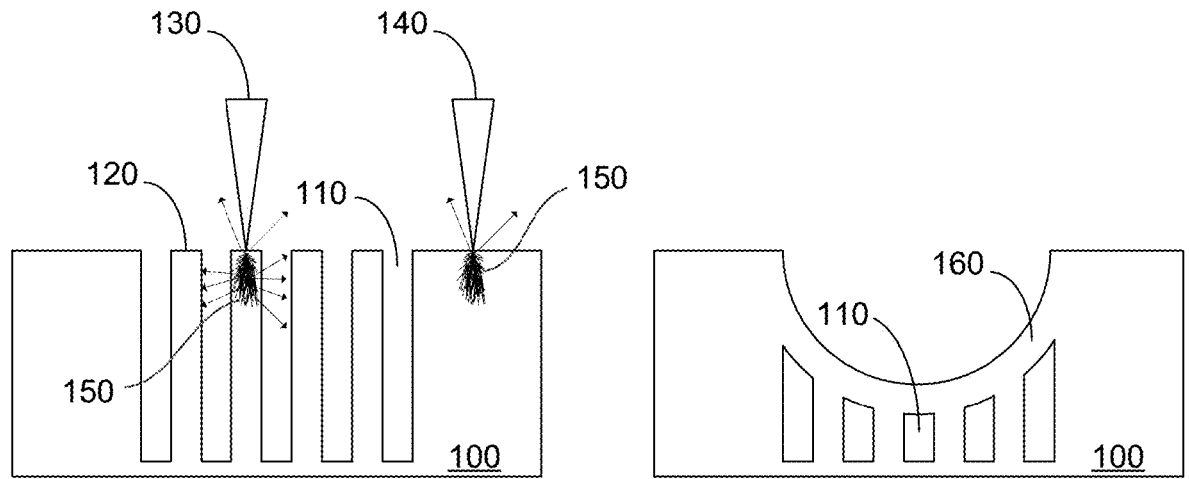
*FIG. 1A*  *FIG. 1B*
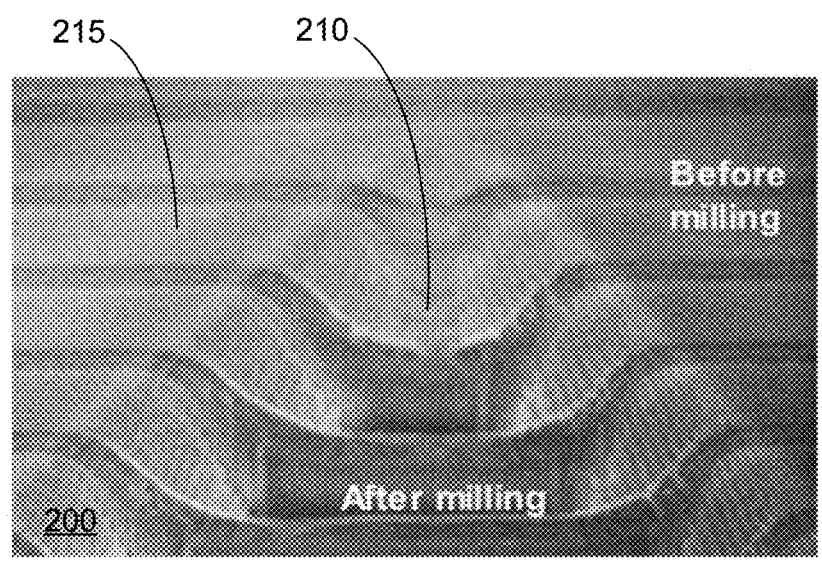
*FIG. 2*

US 10,903,044 B1

FILLING EMPTY STRUCTURES WITH DEPOSITION UNDER HIGH-ENERGY SEM FOR UNIFORM DE LAYERING

BACKGROUND

In the study of electronic materials and processes for fabricating such materials into an electronic structure, a specimen of the electronic structure can be used for microscopic examination for purposes of failure analysis and device validation. For instance, a specimen of an electronic structure such as a silicon wafer can be analyzed in a scanning electron microscope (SEM) or transmission electron microscope (TEM) to study a specific characteristic feature in the wafer. Such a characteristic feature may include the circuit fabricated and any defects formed during the fabrication process. An electron microscope is one of the most useful pieces of equipment for analyzing the microscopic structure of semiconductor devices.

In preparing specimens of an electronic structure for electron microscopic examination, various polishing and milling processes can be used to section the structure until a specific characteristic feature is exposed. As device dimensions are continuously reduced to the sub-half-micron level, the techniques for preparing specimens for study in an electron microscope have become more important. The conventional methods for studying structures by an optical microscope cannot be used to study features in a modern electronic structure due to the unacceptable resolution of an optical microscope.

Although TEM techniques can provide a high resolution image and a detailed description of the internal structure of a specimen that is sufficient for analysis of devices having sub-half micron features, they are only effective for electron transparent samples. Thus, it is a basic requirement for TEM samples that the sample must be thin enough to be penetrated by the electron beam and thin enough to avoid multiple scattering, which causes image blurring. The thin samples extracted from wafers for TEM processing techniques can be brittle and can be subject to fracture or crumbling. For these and other reasons, TEM imaging processes are not practical for some defect review and analysis operations.

A dual column system incorporating both a scanning electron microscope and a focused ion beam (FIB) unit can produce high resolution SEM images of a localized area of an electronic structure formed on a sample, such as a semiconductor wafer. A typical dual column system includes an SEM column, an FIB column, a supporting element that supports the sample and a vacuum chamber in which the sample is placed while being milled (by the FIB column) and while being imaged (by the SEM column).

Removing one or more selected layers (or a portion of a layer) to isolate a structure on the sample is known as delayering and can be done in a dual column system, such as that described above. For example, delayering can be done by: (i) locating a location of interest that should be milled in order to remove a certain thickness of material from the sample (the location of interest can be located by navigation of the SEM and sometimes through the use of an optical microscope), (ii) moving the sample (e.g., by a mechanical supporting element) so that the sample is located under the FIB unit, and (iii) milling the sample to remove a desired amount of material in the location of interest. The delayering process can include forming a hole in the sample (usually sized a few microns to few tens of microns in lateral and vertical dimensions) to expose the material that is desired to be sampled at the bottom of the hole.

When attempting to mill certain structures formed on a sample, the geometry of the structure being milled can present challenges for delayering the structure in a uniform manner. For example, in a device that includes an array of high aspect ratio channel holes or similar structures with solid portions (e.g., slits) between the holes, the area of the channel holes might be milled faster than the areas with solid portions making accurate metrology difficult or even impossible in those areas. Accordingly, improved milling and delayering techniques are desirable.

BRIEF SUMMARY

Embodiments of the disclosure pertain to an improved method and system for removing one or more selected layers (or a portion of a layer) of a sample that includes sub-half-micron features via a delayering process. Embodiments of the disclosure can be employed to uniformly delayer a portion of such a sample even if the delayered portion includes an array of high aspect ratio channel holes having solid portions formed between the holes or a similar structure. While embodiments of the disclosure can be used to delayer structures formed on a variety of different types of samples, some embodiments are particularly useful in delayering samples that are semiconductor wafers or similar specimens.

Some embodiments pertain to a method of evaluating a region of a sample that includes an array of holes separated by solid portions. The method can include positioning the sample within in a vacuum chamber of an evaluation tool that includes a scanning electron microscope (SEM) column and a focused ion beam (FIB); injecting a deposition gas onto the sample; scanning, with a first charged particle beam, a portion of the sample that includes a plurality of holes in the array of holes to locally deposit material within the plurality of holes in the scanned portion from the deposition gas; and milling, with the FIB column, the portion of the sample that includes the plurality of holes in which the material was locally deposited.

The milling step can include scanning an ion beam across both the material deposited in the array of holes and the solid portions separating the holes and can iteratively delayer both the material in the array of holes and the solid portions separating the holes. And, in some implementations, after each iteration of the milling process removes a layer of the sample in the milled area, the sample can be imaged by the SEM column.

In some embodiments the material deposited during the scanning step can be deposited within an upper portion of the plurality of holes, the milling step can mill the sample down to a level that exposes a lower, unfilled portion of the plurality of holes, and the method further include: after the milling step, repeating the injecting and scanning steps to deposit additional material within the unfilled portion of the plurality of holes; and thereafter, milling, with the FIB column, the portion of the sample that includes the plurality of holes in which the additional material was locally deposited.

Some embodiments pertain to a system for evaluating a region of a sample that includes an array of holes separated by solid portions. The system can include a vacuum chamber; a sample support configured to hold a sample within the vacuum chamber during a sample evaluation process; an SEM column configured to direct a first charged particle beam into the vacuum chamber; an FIB column configured to direct a second charged particle beam into the vacuum chamber; a gas supply system configured to inject a deposition gas onto the sample; and a processor and a computer-readable memory coupled to the processor. The memory can include a plurality of computer-readable instructions that, when executed by the processor, cause the system to: inject a deposition gas onto the sample; scan a charged particle beam across a portion of the sample that includes a plurality of holes in the array of holes to locally deposit material within the plurality of holes in the scanned portion from the deposition gas; and mill, with the FIB column, the portion of the sample that includes the plurality of holes in which the material was locally deposited.

Some embodiments pertain to a non-transitory computer-readable memory that stores instructions for evaluating a region of a sample that includes an array of holes separated by solid portions by: positioning the sample within a vacuum chamber of an evaluation tool that includes an SEM column and an FIB column; injecting a deposition gas onto the sample; scanning, with a first charged particle beam, a portion of the sample that includes a plurality of holes in the array of holes to locally deposit material within the plurality of holes in the scanned portion from the deposition gas; and milling, with the FIB column, the portion of the sample that includes the plurality of holes in which the material was locally deposited.

Various implementations of the embodiments described herein can include one or more of the following features. The first charged particle beam can be a high energy SEM beam generated by SEM column or the first charged particle beam can be generated the FIB column operated in a reverse-biased mode. The injecting and scanning can occur simultaneously or the injecting and scanning can occur sequentially and can be repeated multiple times across the sample in different areas of the sample to be delayered. The high energy SEM beam can have a power level of at least 15 KeV. The sample can be a semiconductor wafer. Each hole in the plurality of holes can have a diameter of less than 100 nm and a depth greater than 3 microns. In some implementations the plurality of holes are contact holes for memory channels in a 3D-NAND structure and in some implementations the plurality of holes are holes in which a capacitor in DRAM device can be formed.

Still other embodiments pertain to a method of evaluating a region of a sample that includes an array of holes separated by solid portions. The method can include: positioning the sample on a support in a vacuum chamber of an evaluation tool that includes an SEM column and an FIB column; moving the sample to a location within the chamber under a field-of-view of the SEM column; injecting a deposition gas onto the sample and scanning, with a high energy SEM beam from the SEM column, a portion of the sample that includes a plurality of holes in the array of holes to locally deposit material within the plurality of holes in the scanned portion; moving the sample within the chamber to a position under a field-of-view of the FIB column; and milling, with the FIB column, the portion of the sample that includes the plurality of holes in which the material was locally deposited.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 1A is a simplified cross-sectional view of a semiconductor wafer that includes an array of high aspect ratio channel holes separated by solid portions that can be subject to a milling operation as part of a delayering process;

FIG. 1B is a simplified cross-sectional view of the semiconductor wafer shown in FIG. 1 after a milling operation is performed on the wafer according to the prior art;

FIG. 2 is an SEM image depicting the results of an FIB milling process through an array of high aspect ratio channel holes according to the prior art;

DETAILED DESCRIPTION

Figure 3A:
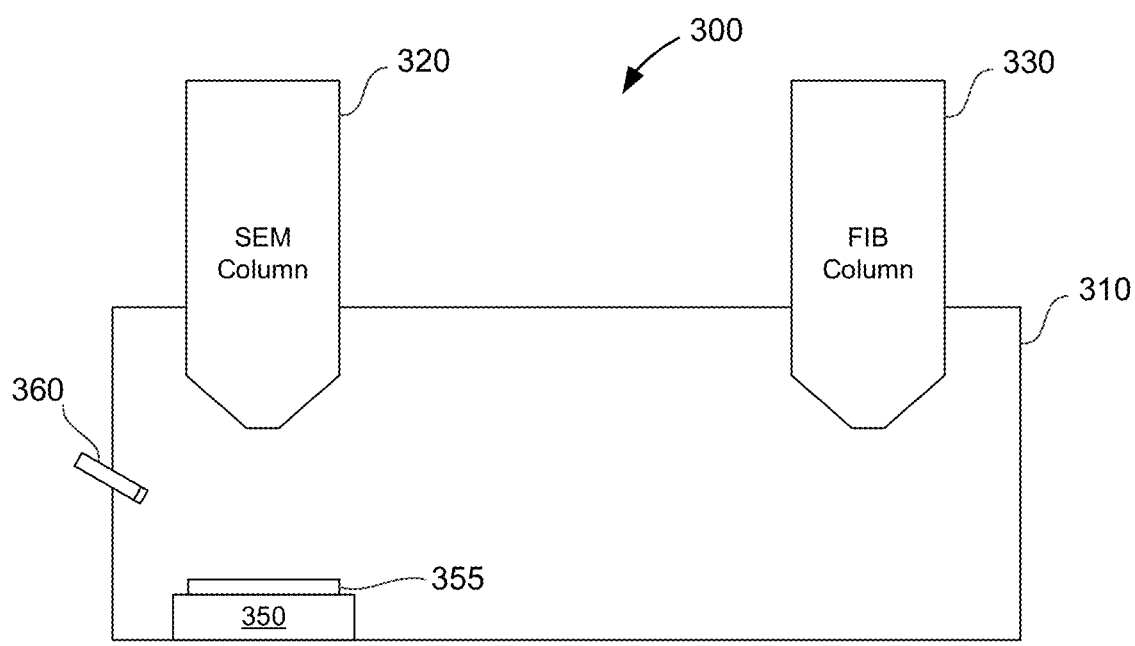
FIG. 3A is simplified illustration of a sample evaluation systems according to some embodiments of the disclosure.

Embodiments of the disclosure can delayer a portion of a sample that includes an array of holes having solid portions formed between the holes. While embodiments of the disclosure can be used to delayer structures formed on a variety of different types of samples, some embodiments are particularly useful in delayering samples that include small feature size and/or high aspect ratio holes (e.g., holes having a diameter of 100 nm or less and/or aspect ratios of 30:1, 40:1 or 60:1 or higher) formed on semiconductor wafers or similar specimens. Non-limiting examples of small feature size, high aspect ratio holes that can be delayered according to embodiments of the disclosure include contact holes for memory channels in 3D-NAND devices and holes in which capacitors in DRAM devices can be formed.

As noted above, when standard delaying techniques are used to delayer a portion of a sample that includes an array of high aspect ratio holes with solid portions (e.g., slits) in between, the holes are typically milled faster than the slits. The inventors believe the non-uniform milling in such a sample is due to sputtering through the walls.

To illustrate, reference is made to FIGS. 1A and 1B, which are simplified cross-sectional views of a semiconductor wafer 100 that includes an array of high aspect ratio channel holes 110 separated by solid portions 120. In FIG. 1A, a milling operation that provides equal ion doses to all areas of the wafer (e.g., the FIB spot spends the same amount of time at each location on the wafer being milled) are performed at two separate areas. A first milling location (represented by beam 130) is performed in the array of channel holes and a second milling location (represented by beam 140) is performed in an area of semiconductor wafer 100 that does not include channel holes 110. The penetration of ions 150 in each area is representative of a real TRIM simulation.

Sputtered material from the milling operations is shown in FIG. 1A by arrows pointing away from each ion penetration area 150. The channel holes are milled faster than the slits due to sputtering through the walls. As a result, and as shown in FIG. 1B, the milling process can create a non-uniform surface with a thin layer 160 of redeposited material that is formed from material sputtered through the walls.

FIG. 2, which is an SEM image of an FIB milling process through an array of channel holes, illustrate this phenomena. Specifically, in FIG. 2 a wafer 200 is imaged at a 45 degree tilt showing a milled area 210 in the array of channel holes while an area 215 of the wafer that also includes the array of holes has not been milled. As evident from FIG. 2, milled area 210 exhibits the non-uniform, trough-shaped profile depicted in FIG. 1B that adversely impacts metrology results.

Embodiments of the disclosure overcome this challenge by filling the array of holes with a material that will avoid the above phenomena while still providing contrast in SEM imaging for hole metrology.

In some embodiments, the array of holes is filled by a deposition process under high-energy SEM in a dual column defect analysis system. One example of a system suitable for filling an array of holes in accordance with embodiments of the disclosure is set forth in FIG. 3A, which illustrates a simplified sample evaluation system 300 according to some embodiments of the disclosure. Sample evaluation system 300 can be used for, among other operations, defect review and analysis of structures formed on semiconductor wafers.

System 300 can include a vacuum chamber 310 along with a scanning electron microscope (SEM) column 320 and a focused ion beam (FIB) column 330. A supporting element 350 can support an sample 355 (e.g., a semiconductor wafer) within chamber 310 during a processing operation in which the sample 355 (sometimes referred to herein as an "object" or a "specimen") is subject to a charged particle beam from one of the FIB or SEM columns and can move the sample within vacuum chamber 310 between the field of view of the two columns 320 and 330 as required for processing.

One or more gases can be delivered to a sample being processed by a gas supply unit 360 for certain operations. For simplicity of explanation gas supply unit 360 is illustrated in FIG. 3A as a nozzle, but it is noted that gas supply unit 360 can include gas reservoirs, gas sources, valves, one or more inlets and one or more outlets, among other elements. In some embodiments gas supply unit 360 can be configured to deliver gas to a sample in the area of the sample that is exposed to the scan pattern of the charged particle beam as opposed to delivering gas to an entire upper surface of the sample. For example, in some embodiments gas supply unit 360 has a nozzle diameter measured in hundreds of micons (e.g., between 400-500 microns) that is configured to deliver gas directly to a relatively small portion of the sample's surface that encompasses the charged particle beam scan pattern. In various embodiments, a first gas supply unit 360 can be configured to deliver gas to a sample disposed under SEM column 320 and a second gas supply unit 360 can be configured to deliver gas to a sample disposed under FIB column 330.

SEM column 320 and FIB column 330 are connected to vacuum chamber 310 so that a charged particle beam generated by either one of the charged particle columns propagates through a vacuumed environment formed within vacuum chamber 310 before impinging on sample 355. SEM column 320 can generate an image of a portion of sample 355 by illuminating the sample with a charged particle beam, detecting particles emitted due to the illumination and generating charged particle images based on the detected particles. FIB column 330 can mill (e.g., drill a hole in) sample 355 by irradiating the sample with one or more charged particle beams to form a cross section and can also smooth the cross section. The cross section can include one or more first portions of a first material and one or more second portions of a second material. The cross section can also include additional portions of other materials. Conveniently, the smoothing operation involves utilizing smaller acceleration voltages in relation to the milling of the sample.

The particle imaging and milling processes each typically include scanning a charged particle beam back-and-forth (e.g., in a raster scan pattern) at a constant rate across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

Figure 3B:
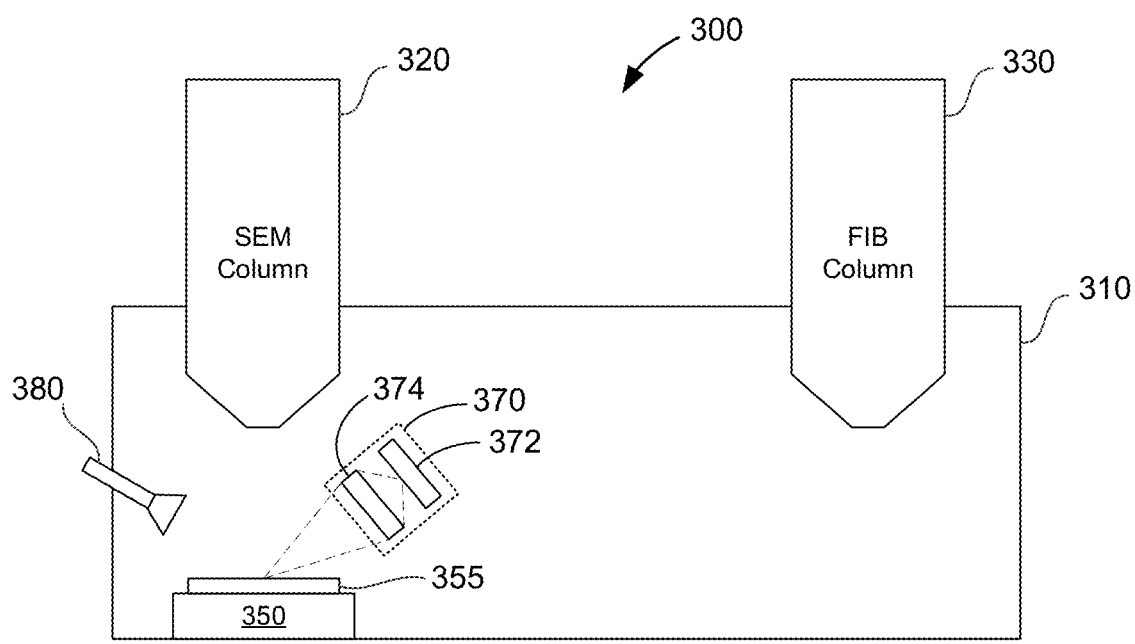
FIG. 3B is simplified illustration of a sample evaluation systems according to additional embodiments of the disclosure.

In some embodiments, a defect analysis system 300 can include an illumination unit 370 and/or a gas spraying unit 380 as shown in FIG. 3B. When system 300 includes illumination unit 370, the system can perform gas assisted etching (discussed below) by exposing a light activated etchant gas to light generated by the illumination unit. Towards this end, illumination unit 370 can include a light source 372 and focusing optics 374 each of which can be located within vacuum chamber 310 in some embodiments and outside the vacuum chamber in other embodiments. Light source 372 can be a monochromatic light source, a broadband light source, a pulsed light source, a continuous light source, a laser, a lamp (such as but not limited to a Mercury lamp) and, in some embodiments, can generate light at wavelengths that do not exceed 200 nanometers. Focusing optics 374 can focus the light from light source 372 onto an area of the sample 355 being processed that can include a cross section, can include only a portion of the cross section or can be located in proximity to the cross section. For example, the area can be located a few nanometers or a few microns from the cross section. It is noted that even when a light beam is focused onto the cross section, the beam may pass through light activated etchant gas that is not located near the cross section. By focusing the light beam onto the mentioned above area, selective etching can occur (mainly or only) near the cross section while other portions of the wafer are not substantially (or even non-substantially) etched.

Gas spraying unit 380 can be included in addition to or instead of gas supply unit 360 and can include various gas sources, reservoirs, valves, etc. as discussed above with respect to gas supply unit 360 and can also include a nozzle that sprays a gas (e.g., a deposition gas or an etchant gas) on the sample in order to deposit material on the sample or etch a cross section to provide a fine topography as described below.

While not shown in either of FIG. 3A or 3B, system 300 can include one or more controllers, processors or other hardware units that control the operation of system 300 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

In addition to generating charged particle images with SEM column 320, system 300 can deposit material on a sample and/or to perform gas-assisted etching of a sample. System 300 can perform gas-assisted etching of the cross section so as to, for example, generate a topography difference between the at least one first portion and the at least one second portion of the cross section. To carry out gas-assisted etching, gas supply unit 360 (or gas spraying unit 380) can supply an appropriate etchant source gas to an area that can include the cross section or can be proximate to the cross section. In some instances the etchant source gas can be activated, while the sample is exposed to a charged particle beam from the SEM column, by secondary electrons emerging from the surface of the sample wherever the cascade of impinging electrons reach. In some instances the etchant source gas can be activated, while the sample is exposed to a charged particle beam from the FIB column, by secondary electrons emerging from the surface of the sample wherever the cascade of impinging ions reach. The gas supplied during a gas-assisted etching step can be non-reactive or slightly reactive in the absence of a charged particle beam. Once activated, the etchant source gas can then become reactive and it can etch different materials at different rates to create a fine topography.

In some embodiments of a gas-assisted etching process according to the disclosure, an electron beam that has an energy level of a few thousand of electron volts (few keV) is used in order to generate the secondary electrons that activate the etchant source gas. In other embodiments it is convenient to use an ion beam of low energy, for example, about a few hundred electron volts, to initiate the above described events that activate the etchant source gas.

Some embodiments of the disclosure can fill an array of high aspect ratio holes (or similar structures) using a dual column defect analysis system, such as system 300 discussed above, by initiating a deposition process under high-energy SEM within the system. Towards this end, a deposition gas can be supplied to the sample 355 by gas supply unit 360 (or gas spraying unit 380) and energy from the SEM column 320 can generate secondary electrons. The cascade of impinging secondary electrons can, in turn, activate the deposition gas resulting in deposition of material on the sample and within the array of holes that is localized to the regions of the sample that are subject to the SEM particle beam. Thus, deposition that occurs according to such embodiments of the disclosure does not simultaneously occur across the entire surface of the sample or wafer being processed. Instead, deposition occurs only in the general areas where the SEM particle beam (which, as a non-limiting example, can have a diameter in the range of 0.5 to 10 nm) impinges upon the wafer and as the particle beam is scanned across those areas of the wafer. Thus, deposition according to some embodiments can be carried out with nanometer resolution.

The localized deposition process can fill the holes with any material that will avoid the non-uniform milling described with respect to FIGS. 1A, 1B and 2 while still providing contrast in SEM imaging for hole metrology. For example, in a high-energy SEM process (tens of kV), the penetration depth of the electrons can be over a micron. Thus, when scanning over the above geometry, the secondary electrons yield is higher through the hole walls, closer to the bottom, than at the surface. As a result, deposition according to some embodiments of the disclosure occurs more rapidly inside the holes given that the deposition gas molecules are present inside the holes. The deposited material can then fill the holes enabling the filled structures to be milled uniformly in a subsequent milling operation.

Figure 4:
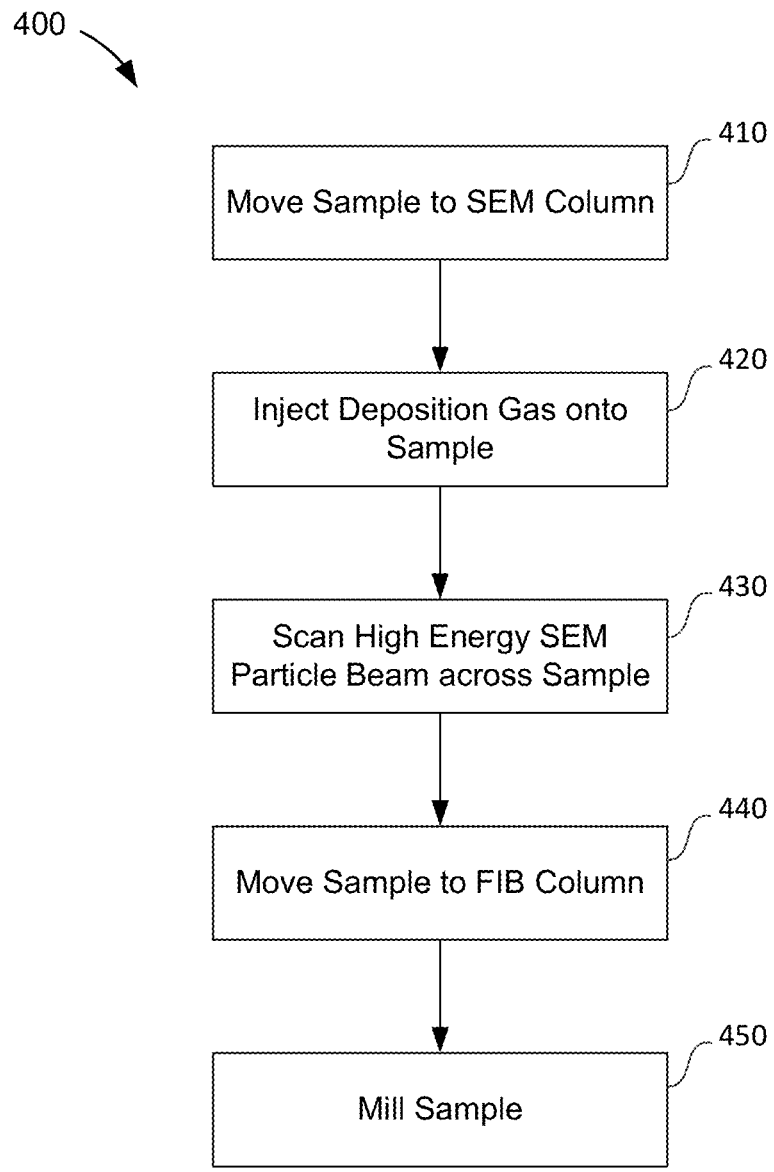
FIG. 4 is a flowchart depicting steps associated with a method of delayering a sample according to some embodiments of the disclosure.
Figure 5A:
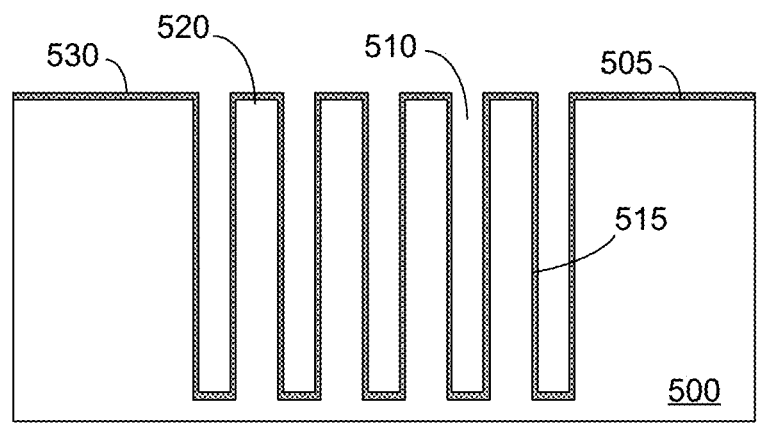
FIGS. 5A-5C are simplified cross-sectional views of a semiconductor wafer at different stages of the delayering process set forth in FIG. 4 according to some embodiments.
Figure 5B:
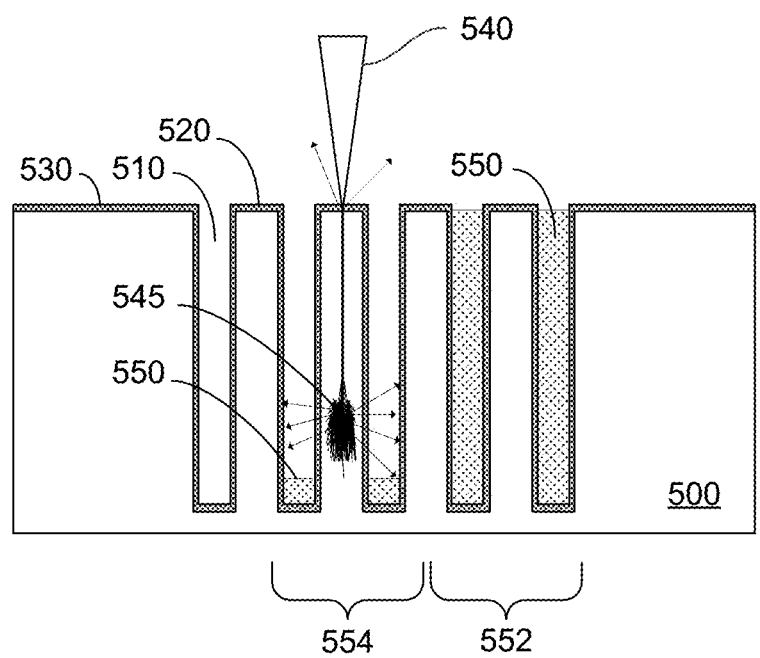
Figure 5C:
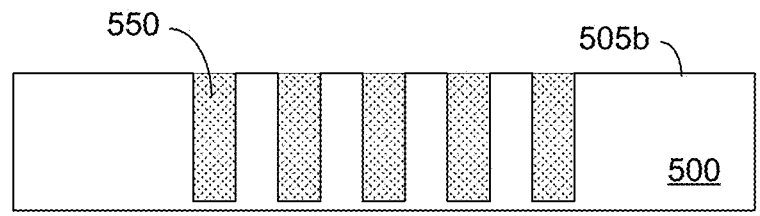

To illustrate, reference is made to FIG. 4, which is a flowchart illustrating steps associated with a method 400 according some embodiments of the disclosure, and to FIG. 5A-5C, which are a simplified cross-sectional view of a semiconductor wafer 500 subjected to the steps of method 400. Semiconductor wafer 500 can include an array of small feature size, high aspect ratio holes 510 formed therein and separated by solid portions or slits 520. Holes 510 and solid portions 520 can be similar or identical to holes 110 and slits 120 discussed above with respect to FIGS. 1A and 1B.

An initial step of method 400 can include moving the wafer 500 under the field-of-view of the SEM column (block 410). Once the wafer is properly position, a deposition gas can be injected onto the wafer (block 420). As shown in FIG. 5A, the deposition gas can adhere to the surfaces of wafer 500 including both an upper surface 505 and surfaces 515 within the holes as shown by gas layer 530. The deposition gas can be selected based on the material that holes 510 are formed in. For example, the deposition gas can be selected to deposit a material (during block 430 discussed below) that has a milling rate similar to the material that holes 510 are formed in (i.e., the material that solid portions 520 is composed of) but has a different contrast to the material of portions 520 for imaging purposes. As various examples, solid portions 520 could include carbon, silicon oxide or other appropriate materials and the deposition gas can be selected to deposit carbon, platinum, tungsten, cobalt, palladium or any appropriate material depending on the material of portions 520. In some specific examples, where the material being deposited is a metal, the deposition gas can include large molecules carrying a single atom of the metal to be deposited—for example, either tungsten hexafluoride ($WF_6$) or hexacarbonyltungsten ($W(CO)_6$) can be the deposition gas for tungsten while trimethyl(methylcyclopentadienyl) platinum (($C_5H_4CH_3$)($CH_3$)$_3$Pt) can be the deposition gas for platinum.

Next, while gas is still being injected onto wafer 500, method 400 can include scanning the SEM charged particle beam 540 across wafer 500 in the portions of the wafer where holes 510 that are to be subsequently milled in block 450 are formed (block 430). The charged particle beam can be focused at the surface 505 of wafer 500 to ensure a high degree of lateral accuracy and the scan rate (i.e., the beam velocity, which as would be understood by a person of skill in the art, is a combination of parameters including pixel size, dwell time and overlap) and i-probe (current) of the particle beam control the deposition rate and can be optimized for best results in terms of deposition quality within the holes. The energy level of the SEM charged particle beam 540 directed toward the wafer in block 430 can be selected such that, based on the charged particle type (e.g., electrons from the SEM column) and the penetrated material, the beam penetrates several microns below surface 505 of the wafer as shown in FIG. 5B by the penetration of electrons 545. The penetration of electrons 545 initiates a reaction in the reactive gas molecules depositing a solid material 550 within the array of holes that is localized to the area where the SEM particle beam impinges upon the wafer. That is deposition only occurs where the SEM beam impinges the wafer. The amount of deposition is controlled by the time spent scanning the injected gas with the SEM charged particle beam. Note, FIG. 5B depicts wafer 500 at a point in time after SEM beam 540 has been scanned across area 552 depositing material within the holes in area 552 and as the SEM beam 540 is just beginning to be scanned across area 554 thus initiating deposition of material within the holes in area 554.

Once SEM beam 540 has been fully scanned across the portions of the wafer that deposition is desired (e.g., across all the portions of the holes that are to be milled), material 550 will fill the holes in those areas. Next, the wafer can be moved to the field-of-view of the FIB column (block 440) and the filled areas can be milled (block 450) by the FIB column in a uniform manner as shown in FIG. 5C where, once the milling process is complete, surface 505 has been milled down to a lower relatively flat surface 505b.

In some embodiments the milling process of block 450 can include multiple sub-steps. For example, in a first sub-step, an uppermost layer of the portion to be delayered can be milled and removed. The sample can then be moved back to the field of view of the SEM column and the milled area can be imaged. Next, the sample can be moved back to the FIB column and a subsequent layer can be milled in the same portion of the wafer. This process of removing a layer of the wafer in a particular area and imaging the area can be repeated multiple times essentially carving out a hole in the sample that gets deeper with each iteration. The data captured during the imaging portion of the process can be used to evaluate the milled and imaged portion including, for example, generating a three-dimensional model of the sample in the milled area.

Figure 5D:
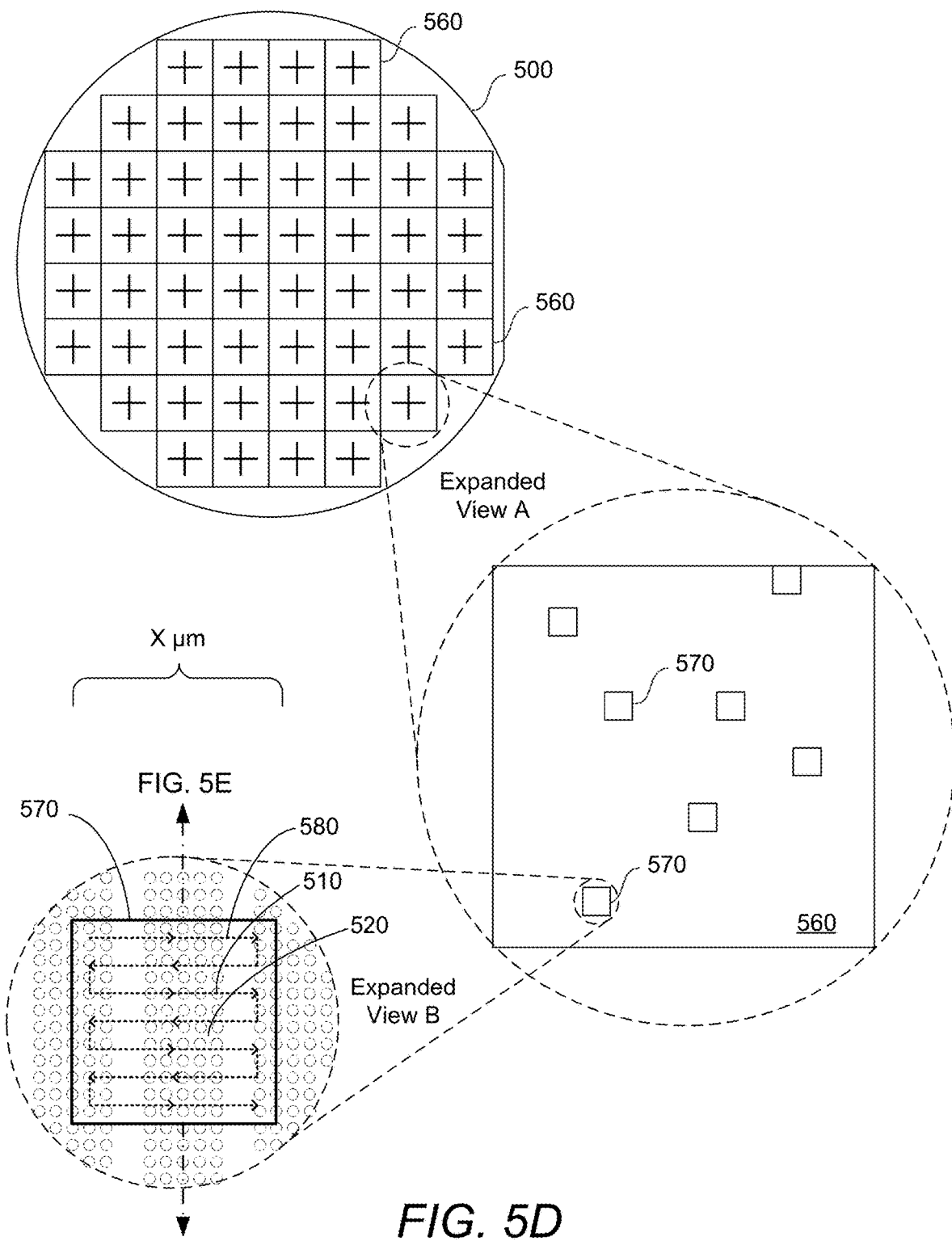
FIG. 5D is a simplified illustration of an area on a semiconductor wafer that can be delayered according to some embodiments.
Figure 5E:
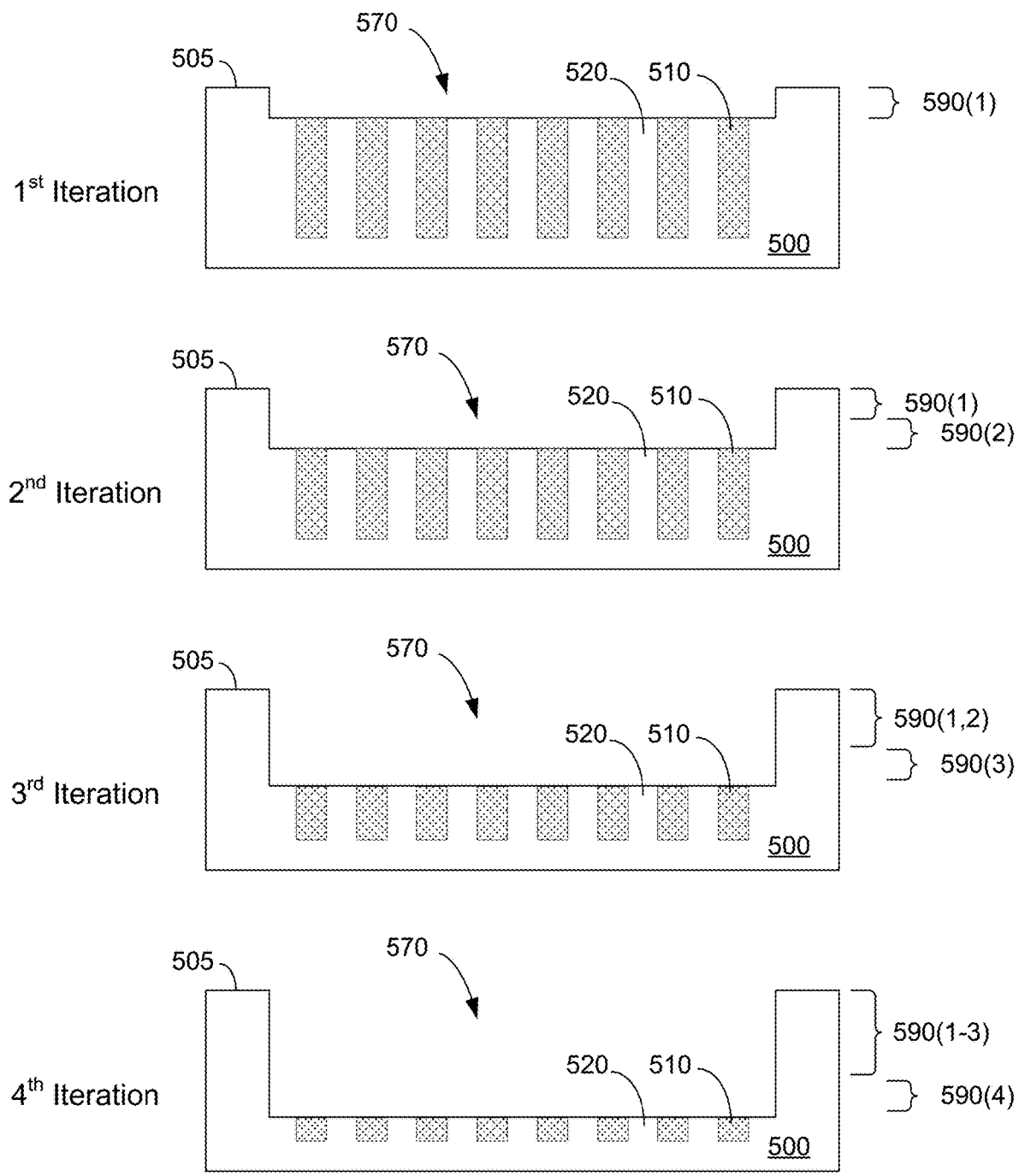
FIG. 5E depicts simplified cross-sectional views of a semiconductor wafer as different layers are sequentially milled away from the wafer according to some embodiments.

To further illustrate, reference is made to FIGS. 5D and 5E where FIG. 5D is a simplified illustration of the semiconductor wafer 500 depicted in FIGS. 5A-5C and FIG. 5E is a simplified cross-section of wafer 500 as multiple layers within a region 570 of wafer 500 are delayered and analyzed. FIG. 5D includes a top view of wafer 500 along with two expanded views of specific portions of wafer 500. Wafer 500 can be, for example, a 200 mm or 300 mm semiconductor wafer and can include multiple integrated circuits 560 (fifty two in the example depicted) formed thereon. The integrated circuits 560 can be at an intermediate stage of fabrication and the delayering techniques described herein can be used to evaluate and analyze one or more regions 570 of the integrated circuits that include an array of high aspect ratio holes separated by solid portions. For example, Expanded View A of FIG. 5D depicts multiple regions 570 of one of the integrated circuits 560 that can be evaluated and analyzed according to the techniques described herein. Expanded View B depicts one of those regions 570 that includes an array of holes 510 and solid portions 520 as discussed above with respect to FIGS. 5A-5C.

Some embodiments can analyze and evaluate region 570 by sequentially milling away an uppermost layer of the region and imaging the milled region during the milling step (block 450). The milling process can mill region 570 by scanning the FIB beam back and forth within the region according to a raster pattern, such as scan pattern 580 depicted in a simplified format in the Expanded View B of FIG. 5D, to remove an upper portion of region 570. The removed portion can have a specific depth in the Z direction and can be removed in its entirety from region 570 in both the X and Y directions. For example, if region 570 is a square having a length and width of X microns, separate slices of X by X microns that are each Z microns deep can be sequentially removed from region 570 during the milling process where, in each layer, the removed square includes material that was deposited within the holes according to method 400 as well as solid portions between the holes. Thus, as shown in FIG. 5E, a first milling sub-step can remove a layer 590(1), which is essentially a square of X by X microns, from region 570 and images of the region with layer 570(1) removed can be generated by the SEM column. Next, a second milling sub-step can remove a layer 590(2), again essentially a square of X by X microns, from region 570 and images of the region with layers 590(1) and 590(2) removed can be generated by the SEM column. While FIG. 5E depicts four iterations of a delayering process, embodiments can repeat the delayering process any number of times as appropriate or as required for a particular analysis and evaluation situation. Also, instead of milling the same sized areas (i.e., square of X by X microns in the example) in each iteration of the delayering process, in some embodiments one or more subsequent iterations can remove progressively smaller portions of the region than a previous iteration.

Referring back to FIG. 4, embodiments of the disclosure can be used to fill very small feature sized holes that are also very deep thus having a very high aspect ratio. As non-limiting examples, various embodiments can, in blocks 420, 430, fill holes having a diameter of less than 100 nm and a depth greater than 3 microns, a diameter of 80 nm or less and a depth of 3-5 microns, and a diameter between 70-80 nm and a depth between 4-5 microns.

The energy level of the SEM charged particle beam should generally be sufficiently high to reach high secondary electron yield at a location far enough beneath the upper surface of the wafer such that deposition material reaches the bottom of the holes that are being filled. In some embodiments, the SEM will have an energy level in the tens of KeV (e.g., an energy level of 15 KeV or higher, an energy level of 40 KeV or higher or an energy level of 30 KeV or higher). At such energy levels, the particle beam can penetrate more than a micron or 2-3 microns beneath the upper surface of the wafer.

Some currently known dual column SEM/FIB systems have an upper limit on the energy level of the SEM beam, such as 30 KeV. Since the energy level of the SEM beam determines the depth that the beam will penetrate within a given sample, some embodiments can employ a multi-step approach when filling holes that are too deep to be filled by the tool in a single pass. For example, if a particular tool can generate a maximum 30 KeV SEM beam that penetrates a particular sample 3 microns deep, some embodiments of the disclosure can uniformly mill small feature size, high aspect ratio holes that are deeper than 3 microns using a multi-step, dep-mill-repeat process. As an example, reference is made to FIGS. 6A-6D, which are simplified cross-sectional views of a wafer 600 that has an array of holes 610 that are approximately 6 microns deep and separated by solid portions 620.

Figure 6A:
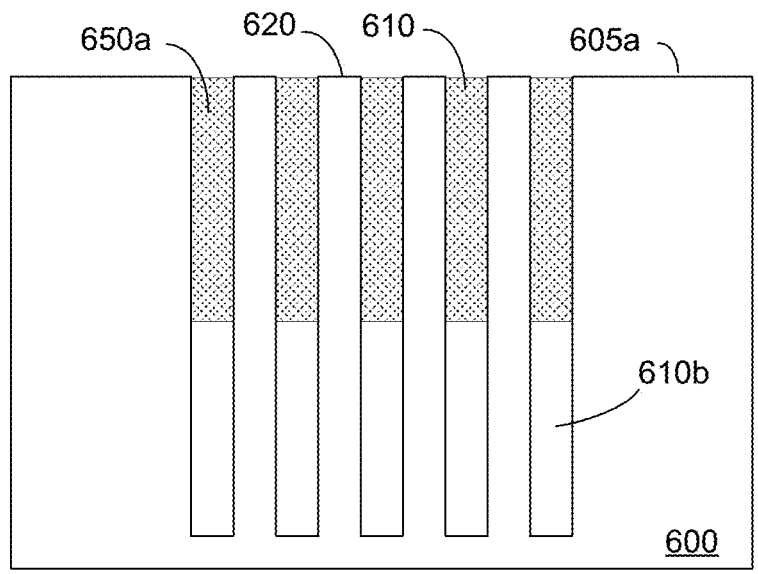
FIGS. 6A-6D are simplified cross-sectional views of another semiconductor wafer at different stages of the delayering process according to some embodiments.

In order to mill holes 610, embodiments of the disclosure can deposit a first layer of material 650a within the holes to fill the upper 3 microns of the holes using the techniques described above with respect to FIG. 4. After this initial deposition step, deposited material 650a can extend from upper surface 605a to a depth within wafer 600 of approximately 3 microns. As shown in FIG. 6A, since holes 610 are approximately 6 microns deep, a portion 610b of the holes (e.g., about 3 miconrs) will be unfilled.

Figure 6B:
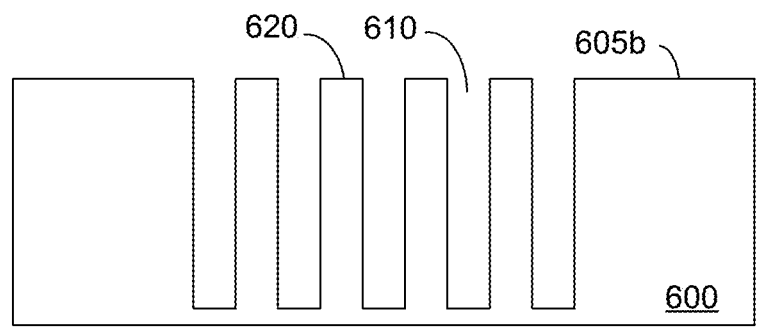
Figure 6C:
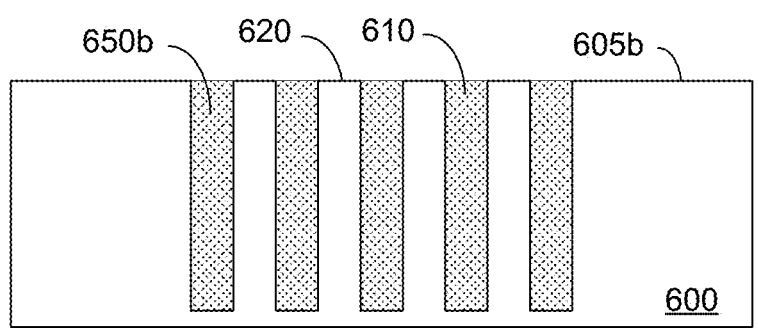
Figure 6D:
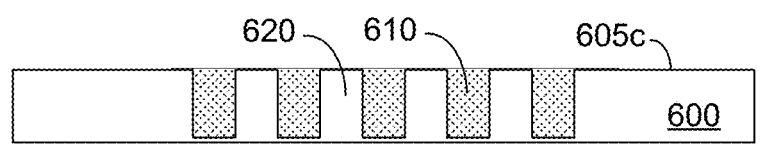

Wafer 600 can be milled to remove the portion of the wafer that includes material 650a as shown in FIG. 6B leaving holes 610 that now have a depth of approximately 3 microns from a milled upper surface 605b. Holes 610 can then be filled and milled further by repeating the steps of FIGS. 6A and 6B in accordance with the method of FIG. 4 down to a surface 610c as shown in FIGS. 6C and 6D, respectively. As another example, holes that are 9 microns deep could be filled by repeating the dep-mill steps three times rather than just twice. In this manner, embodiments of the disclosure can uniformly mill holes that would otherwise be too deep to get deposition material into the bottom portion of the hole.

In some embodiments, a technique similar to that discussed with respect to FIG. 4 can be employed except that gas flow can be stopped before applying the charged SEM beam to the wafer. The enables the gas molecules on the top surface to detach while molecules that traveled inside the holes still remain as the deep geometry within the holes results in longer characteristic times for detachment. The energy level of the SEM beam can be selected so that the electrons penetrate deep within the bulk material between the holes (i.e, the hole walls) to the desired depth for deposition. A sufficiently high energy level of the SEM beam can provide higher secondary electron yields at the bottom of the holes as opposed to the top. Further, the lack of deposition gas molecules on the upper surface can be helpful in avoiding fast deposition at the top of the hole that might otherwise result in closing the hole at the top prior to filling the hole at the bottom. Depending on how long the gas remains in the holes after gas flow is turned off, some embodiments that employ this technique can repeat the sequence of introducing gas into the chamber, stopping the gas flow and then exposing the wafer to an SEM beam to initiate deposition deep within the holes multiple times to deposit material within holes present at different locations of the wafer.

Figure 7:
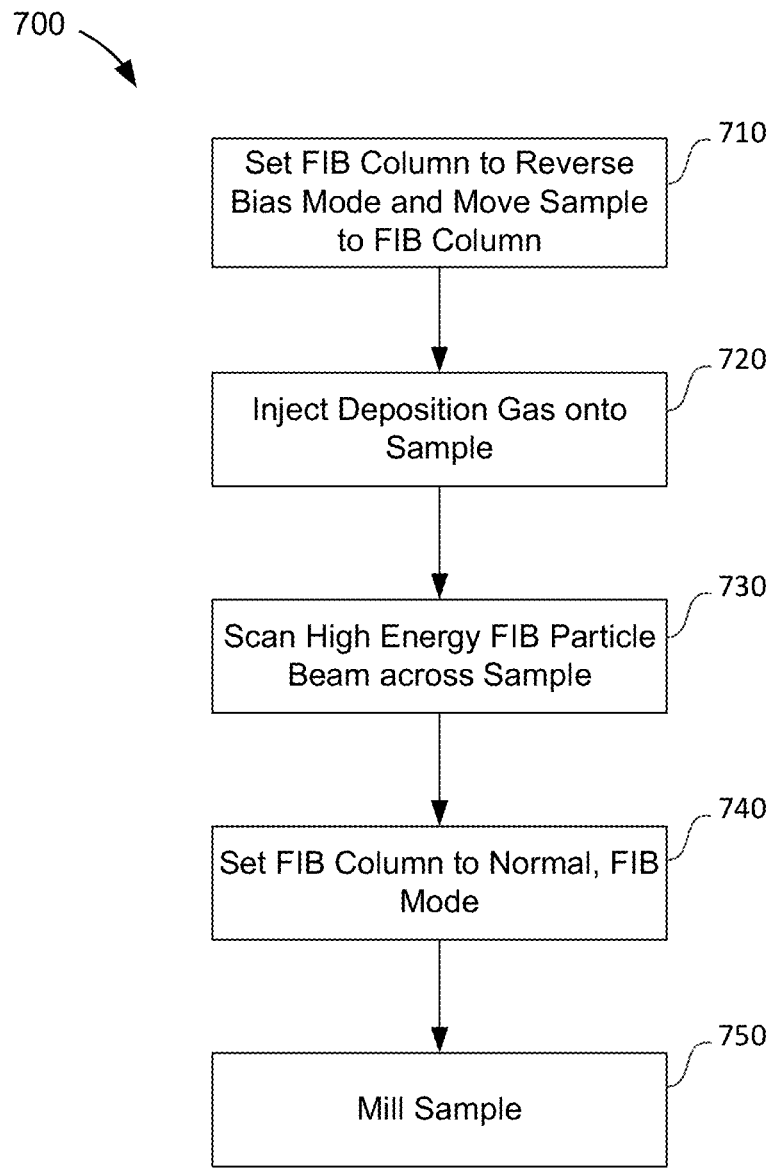
FIG. 7 is a flowchart depicting steps associated with a method of delayering a sample according to additional embodiments of the disclosure.

In additional embodiments where the ion beam source of the FIB column is a plasma source, a dual mode FIB can be used to both deposit material within a desired area on a sample that includes holes and the subsequently mill the desired area as part of a delayering process. To illustrate, reference is made to FIG. 7, which is a flowchart illustrating steps associated with a method 700 according some embodiments of the disclosure. As set forth in FIG. 7, method 700 starts by reversing the energy of the plasma source of the FIB column and the extraction voltage (as well as other necessary voltages as would be understood by a person of skill in the art in order to operate the FIB column in a reverse bias mode), and moving the sample under the field of view of the FIB column (block 710). When the FIB column is operated in a reverse bias mode, the FIB column can act as an SEM column. Next, a deposition gas can be injected onto the sample (block 720) and the reverse-biased FIB charged particle beam can be focused at the surface of the sample and scanned across a portion of the sample in the portions of the wafer where holes that are to be subsequently milled are formed (block 730). The energy level of the reverse-biased FIB charged particle beam directed toward the wafer in block 430 can be selected such that, based on the charged particle type and the penetrated material, the beam penetrates several microns below the surface of the wafer by the penetration. As an example, in some embodiments the energy level used to generate the reverse-biased FIB beam is greater than 15 KeV. The deposition process that occurs in blocks 720 and 730 can be similar to the process described above with respect to FIG. 4, blocks 420 and 430 and illustrated with respect to FIG. 5B.

Once the reverse-biased FIB charged particle beam has been fully scanned across the portions of the wafer that deposition is desired (e.g., across all the portions of the holes that are to be milled), the deposited material will fill the holes in those areas. Next, the FIB column can be switched back to normal mode (block 740) and the filled areas can be milled (block 750) by the FIB column in a uniform manner.

In still other embodiments, a dual mode FIB can be used to both deposit material within a desired area on a sample that includes holes and the subsequently mill the desired area as part of a delayering process using the dep-mill-repeat process described with respect to FIG. 6. That is, in some embodiments a dual mode FIB can be used to delayer structure that are too deep to fill with a single deposition step. For example, a first layer of material can be deposited within the holes to fill an upper portion of the holes using the techniques described above with respect to FIG. 7, blocks 720, 730. After this initial deposition step, the deposited material can extend from an upper surface of the sample to an intermediate depth within the very deep hole without reaching the bottom portion of the hole. The sample can then be milled to remove the portion of the sample that includes the deposited material and the remaining portions of the holes in the milled area that were not filled with deposited material during the first deposition step can be filled and milled further by repeating the deposition and milling one or more times in accordance with the method of FIG. 7. This dep-mill-repeat process can provide an alternative method to uniformly delayer holes that would otherwise be too deep to get deposition material into the bottom portion of the hole in a single deposition step.

Any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

The foregoing description, for purposes of explanation, used specific nomenclature to provide a thorough understanding of the described embodiments. However, it will be apparent to one skilled in the art that the specific details are not required in order to practice the described embodiments. For example, while several specific embodiments of the disclosure described above use an example sample that includes an array of small feature size, high aspect ratio channel holes separated by solid slits, the disclosure is not limited to samples having such a geometry. Embodiments of the disclosure can be equally beneficially applied to delayer a sample having filled hole arrays with etched portions or slits between the filled holes. Embodiments can also be beneficially used on any sample having very small feature sizes that are etched (e.g., trenches) or otherwise formed at high aspect ratios between solid portions of the sample. Additionally, embodiments of the disclosure are not limited to delayering a sample having holes (or other features) of a particular dimensions or aspect ratio and can be beneficially applied to delayer a sample having holes or other features that are larger and/or shallower than those specifically discussed herein.

Thus, the foregoing descriptions of the specific embodiments described herein are presented for purposes of illustration and description. They are not target to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

Because the illustrated embodiments of the present disclosure may for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of evaluating a region of a sample that includes an array of holes separated by solid portions, the method comprising:
    positioning the sample within in a vacuum chamber of an evaluation tool that includes a scanning electron microscope (SEM) column and a focused ion beam (FIB);
    injecting a deposition gas onto the sample;
    scanning, with a first charged particle beam, a portion of the sample that includes a plurality of holes in the array of holes to locally deposit material within the plurality of holes in the scanned portion from the deposition gas; and
    milling, with the FIB column, the portion of the sample that includes the plurality of holes in which the material was locally deposited.

2. The method of claim 1 wherein milling the portion of the sample includes scanning an ion beam across both the material deposited in the array of holes and the solid portions separating the holes to iteratively delayer both the material in the array of holes and the solid portions separating the holes.

3. The method of claim 2 wherein, after each layer is removed by the milling process, the sample is imaged by the SEM column.

4. The method of claim 1 wherein the first charged particle beam is a high energy SEM beam generated by the SEM column.

5. The method of claim 4 wherein the injecting and scanning occur simultaneously.

6. The method of claim 4 wherein the high energy SEM beam has a power level of at least 15 KeV.

7. The method of claim 6 wherein a penetration depth of electrons generates high secondary electron yield at a location far enough beneath an upper surface of the sample that deposition material reaches a bottom of multiple holes in the plurality the holes.

8. The method of claim 4 wherein the injecting and scanning occur sequentially and are repeated multiple times across the sample in different areas of the sample to be delayered.

9. The method of claim 1 wherein the ion beam source of the FIB column is a plasma source and the first charged particle beam is generated with the FIB column operated in a reverse-biased mode.

10. The method of claim 1 wherein the material deposited during the scanning step deposits material within an upper portion of the plurality of holes, the milling step mills the sample down to a level that exposes a lower, unfilled portion of the plurality of holes; and wherein the method further includes:
    after the milling step, repeating the injecting and scanning steps to deposit additional material within the unfilled portion of the plurality of holes; and
    thereafter, milling, with the FIB column, the portion of the sample that includes the plurality of holes in which the additional material was locally deposited.

11. The method of claim 1 wherein the sample is a semiconductor wafer.

12. The method of claim 11 wherein each hole in the plurality of holes has a diameter of less than 100 nm and a depth greater than 3 microns.

13. The method of claim 11 wherein the plurality of holes are contact holes for memory channels in a 3D-NAND structure.

14. The method of claim 11 wherein the plurality of holes are holes in which a capacitor in DRAM device can be formed.

15. A system for evaluating a region of a sample that includes an array of holes separated by solid portions, the system comprising:
    a vacuum chamber;
    a sample support configured to hold a sample within the vacuum chamber during a sample evaluation process;
    a scanning electron microscope (SEM) column configured to direct a first charged particle beam into the vacuum chamber;
    a focused ion beam (FIB) column configured to direct a second charged particle beam into the vacuum chamber;
    a gas supply system configured to inject a deposition gas onto the sample;
    a processor and a memory coupled to the processor, the memory including a plurality of computer-readable instructions that, when executed by the processor, cause the system to:
    inject a deposition gas onto the sample;
    scan a charged particle beam across a portion of the sample that includes a plurality of holes in the array of holes to locally deposit material within the plurality of holes in the scanned portion from the deposition gas; and
    mill, with the FIB column, the portion of the sample that includes the plurality of holes in which the material was locally deposited.

16. The system set forth in claim 15 wherein the first charged particle beam is a high energy SEM beam generated by the SEM column.

17. The system set forth in claim 15 wherein the ion beam source of the FIB column is a plasma source and the first charged particle beam is generated by the FIB column operated in a reverse-biased mode.

18. A non-transitory computer-readable memory that stores instructions for evaluating a region of a sample that includes an array of holes separated by solid portions by:
    positioning the sample within in a vacuum chamber of an evaluation tool that includes a scanning electron microscope (SEM) column and a focused ion beam (FIB);

injecting a deposition gas onto the sample;

scanning, with a first charged particle beam, a portion of the sample that includes a plurality of holes in the array of holes to locally deposit material within the plurality of holes in the scanned portion from the deposition gas; and milling, with the FIB column, the portion of the sample that includes the plurality of holes in which the material was locally deposited.

19. The non-transitory computer-readable memory set forth in claim 18 wherein the first charged particle beam is a high energy SEM beam generated by the SEM column.

20. The non-transitory computer-readable memory set forth in claim 18 wherein the ion beam source of the FIB column is a plasma source and the first charged particle beam is generated by the FIB column operated in a reverse-biased mode.

* * * * *